United States Patent [19]
Peltier et al.

[11] Patent Number: 5,529,502
[45] Date of Patent: Jun. 25, 1996

[54] SOLDERLESS FLEXIBLE CIRCUIT CARRIER TO PRINTED CIRCUIT BOARD INTERCONNECTION

[75] Inventors: Mark R. Peltier, Bolingbrook, Ill.; Julio C. Castaneda, Coral Springs, Fla.; Stuart A. Heilsberg, Arlington Heights, Ill.

[73] Assignee: Motorola, Inc., Schaumburg, Ill.

[21] Appl. No.: 252,466

[22] Filed: Jun. 1, 1994

[51] Int. Cl.⁶ ...................................................... H01R 9/07
[52] U.S. Cl. ................................................ 439/67; 439/493
[58] Field of Search ................................ 439/67, 77, 493

[56] References Cited

U.S. PATENT DOCUMENTS

| | | | |
|---|---|---|---|
| 3,102,767 | 9/1963 | Schneck | 439/493 |
| 3,492,538 | 1/1970 | Fergusson | 439/67 |
| 3,602,870 | 8/1971 | Willard | 439/493 |
| 4,531,793 | 7/1985 | Hochgesang | 439/67 |
| 4,636,016 | 1/1987 | Ford, Jr. | 439/77 |
| 4,752,244 | 6/1988 | Kuhl et al. | 439/635 |
| 4,781,601 | 11/1988 | Kuhl et al. | 439/77 |
| 4,784,615 | 11/1988 | Teng-Hong | 439/496 |
| 4,938,702 | 7/1990 | English | 439/67 |

OTHER PUBLICATIONS

"Flexible Circuits" by Steve Gurley, Marcel Dekker Inc., 1984, Chapter 7, pp. 133–150.

*Primary Examiner*—Neil Abrams
*Attorney, Agent, or Firm*—Val Jean F. Hillman

[57] ABSTRACT

An assembly for electrically interconnecting a printed circuit board (106) to a flexible circuit carrier (104) includes a retention clip (102) for mechanically pressing the printed circuit board (106) against the flexible circuit carrier (104). The printed circuit board (106) includes a set of locating features (110) which match with locating features (116) located on the flexible circuit (104). A set of retention features (114) match up with side locks (122) located on the retention clip) and maintain the clip (102) engaged to the printed circuit board (106) in a mechanically biased state. The clip (102) also includes alignment apertures (118) for receiving the locating features (110) on the printed circuit board to aid in alignment of the assembly.

15 Claims, 3 Drawing Sheets

SOLDERLESS FLEXIBLE CIRCUIT CARRIER TO PRINTED CIRCUIT BOARD INTERCONNECTION

TECHNICAL FIELD

This invention relates generally to interconnection devices and more specifically to an interconnection clip and assembly for electrically interconnecting a flexible circuit carrier to a printed circuit board.

BACKGROUND

The typical prior art approaches for electrically interconnecting a flexible circuit carrier ("flex circuit" or "flex") to a printed circuit board ("PCB") are costly due to the number of parts and labor involved in the prior art interconnection approaches. There are three commonly used approaches for electrically interconnecting a PCB to a flex circuit.

In the first approach, the flex circuit has a thermoplastic header overmolded or soldered to a connector end of the flex circuit. The PCB has a mating connector header and the two ends are then pressed or snapped together to make the electrical interconnection between the PCB and flex circuit. In order to keep the mated parts from loosening due to shock or vibration, this interconnection technique will sometimes require the use of screws or other types of fasteners on both sides of the connection to assure mechanical stability of the interconnection.

A second prior art interconnection approach relies on exposed pads on the flex to make contact to a header located on the PCB. In order to keep the flex from loosening from the header, the header may have a plastic piece that press fits or snaps in after the flex is inserted such as a zero-insertion-force connector.

The third interconnection approach typically used in the art involves soldering the flex directly to the PCB. While reliable and cost effective, this scheme produces an assembly which can not be serviced if the assembly becomes inoperable for any reason. Thus, once the interconnection is performed a new assembly or a new flex circuit must be used, thereby increasing the overall repair cost.

Major drawbacks to the first two schemes noted above are cost and reliability. The direct material cost of the header plus the labor time required to assemble the connectors to the PCB and flex circuit. The third scheme has the major problem that once the flex is soldered to the PCB, the assembly needs to be replaced, since attempting to disconnect the soldered flex from the PCB requires a lot of labor in order not to damage the assembly.

A need thus exists for a scheme for electrically interconnecting a flex circuit to a PCB that provides for both good electrical connections between the PCB and flex and also simplifies the manufacturing of the assembly.

DETAILED DESCRIPTION OF THE PREFERRED EMBODIMENT

Figure 1:
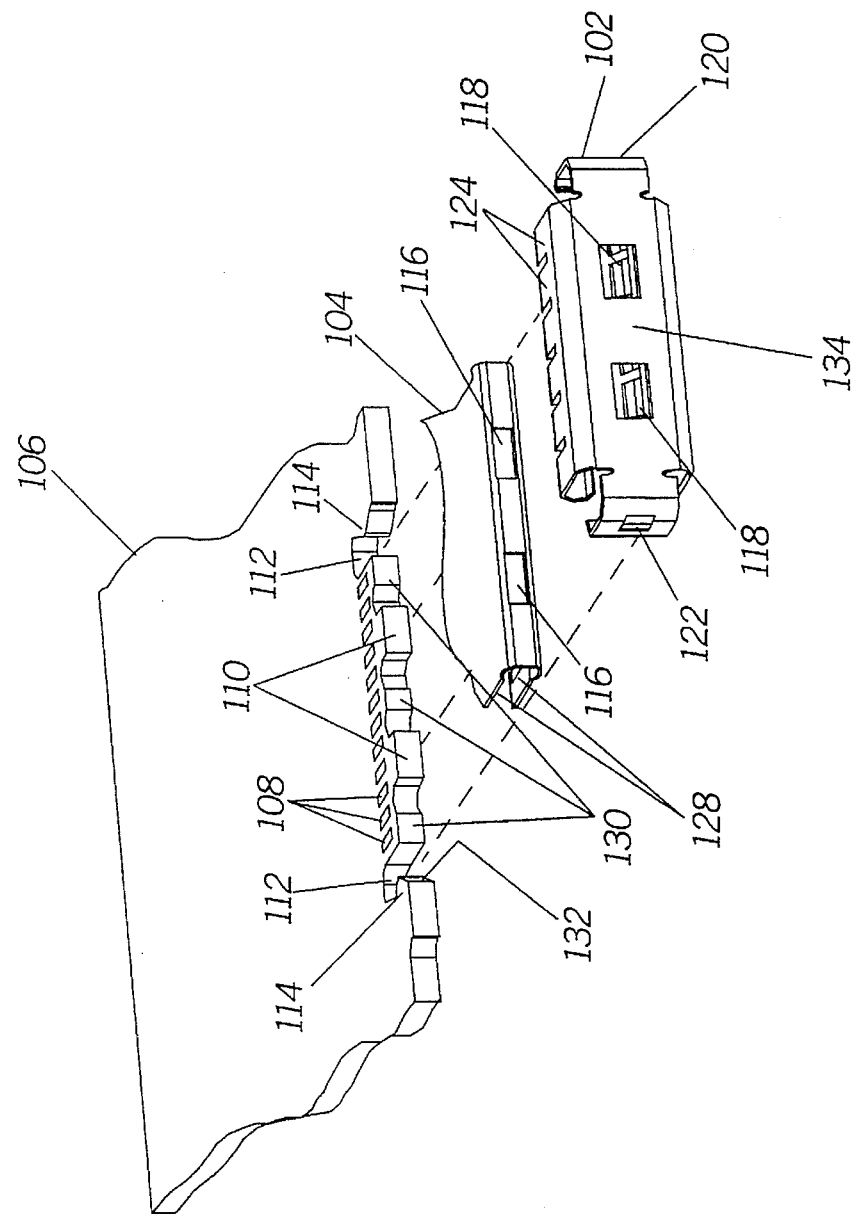
FIG. 1 shows an exploded view of an interconnect assembly in accordance with the present invention.

Referring now to the drawings and more specifically to FIG. 1, there is shown an exploded view of an interconnection assembly in accordance with the invention. The assembly comprises a substrate such as a printed circuit board 106. The PCB includes a set of interconnection pads 108 which in the preferred embodiment are located on both first and second major surfaces of the PCB 106. The interconnection pads located on PCB 106 are spaced 1.27 millimeter (0.050 inch) from the center of one pad to the adjacent pad, with each pad having a width of 0.635 millimeter (0.025 inch) and a length of 2.032 millimeter (0.080 inch). From the start of the first pad to the end of the last pad there is an overall length of 14.605 millimeter (0.575 inch). Matching interconnection pads 128 are located on flexible circuit carrier 104 and are configured in such a way that one corresponding pad 128 on the flexible circuit 104 becomes in register with each of the interconnection pads 108 located on the printed circuit board 106, once flexible circuit 104 is presented onto the printed circuit board 106. Preferably, the plating material used on interconnection pads 108 and pads 128 are compatible to each other, in order to minimize corrosion potential. For example, pads 108 and 128 can be gold plated in order to provide for improved electrical interconnection between the corresponding pads.

Printed circuit board 106 includes two PCB locating features such as alignment protrusions 110 located on the edge surface of the PCB which help align the flexible circuit 104 and clip 102 to the printed circuit board 106. Both flexible circuit carrier 104 and clip 102 include a set of locating features, such as alignment apertures 116 and 118, respectively, which are fitted with the alignment protrusions 110 found on PCB 106. Since flex circuit 104 and clip 102 are located with said locating features 116 and 118, pad-to-pad tolerance stack-up is minimized. A set of cavities 112, found in PCB 106, provide for reception of the side members 120 of clip 102. Located in each cavity area 112 is a retention feature 114 having a ramped lead-in 132 for easy insertion of clip 102 end members 120 into a cavity area 112. Ramped lead-in 132 helps initially located the clip 102 from side-to-side until side locks or locking apertures 122 on clip 102 end members 120 engage with the retention features 114 found on the printed circuit board 106. Retention features 114 are preferably hooked tab members which engage with the side locks 122 on clip 102. Side locks in the preferred embodiment are apertures located on each of the cantilevered members 120. Clip 102 further includes two rows of contact springs 124 which in the preferred embodiment take the form of curved spring fingers and extend from the top and bottom margins of clip main section 134. The cantilevered clip end members 120 accordingly, extend from the side margins of main section 134.

Figure 2:
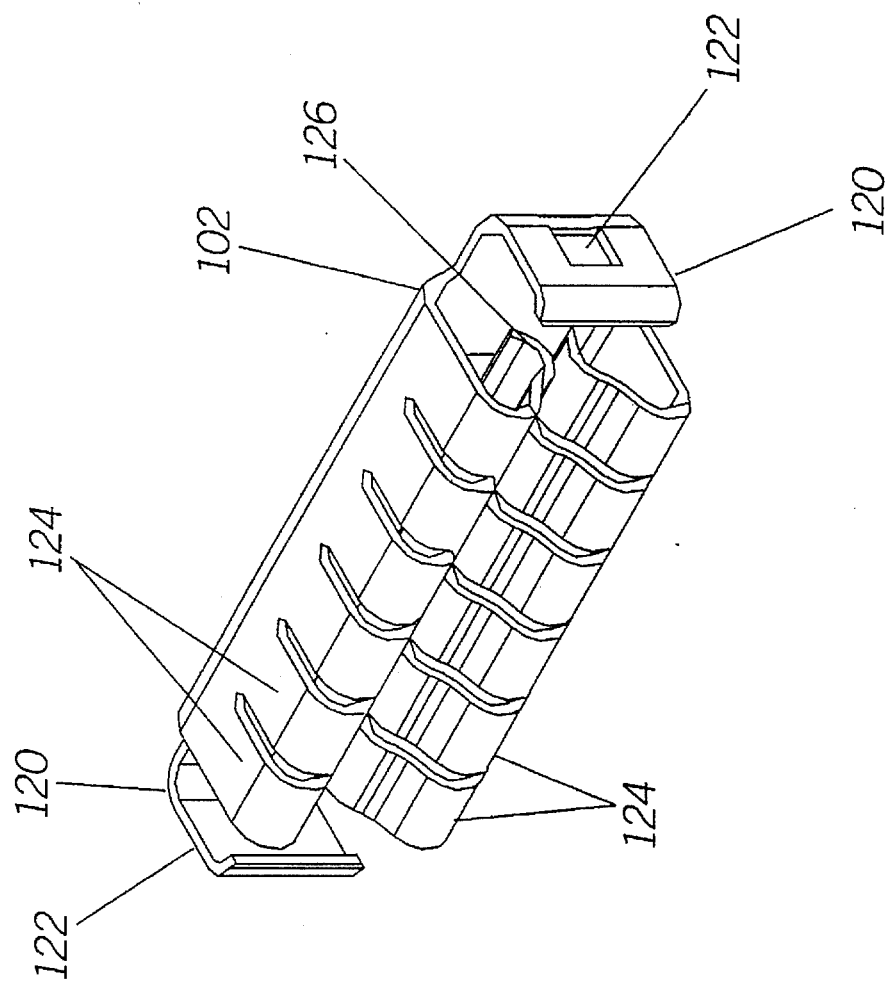
FIG. 2 shows an isometric view of an interconnection clip in accordance with the invention.

Referring now to FIG. 2, a view of the retention clip 102 in accordance with the invention is shown. Clip 102, as previously mentioned, includes two rows of contact springs or contact fingers 124. Each of the spring fingers 124 have bent end features 126. Each of the clip end members 120 include a side lock 122 which engages with a corresponding retention feature 114 located on printed circuit board 106. The clip end members 120 are cantilevered so that they can compress inward towards the spring fingers 124 when the retention clip 102 begins to be engaged with the ramped lead-ins 132 found on each of the retention features 114. The end portions of each cantilevered members 120 are also bent inward in order to help the presentation of clip 102 to printed circuit board 106. The bent end members slide against ramped lead-in sections 132 and direct the cantilevered members 120 inward in order for apertures 122 to latch onto the retention features 114.

Each of the contact fingers has a bumped end-section 126 which provides for good mechanical bias to be applied against the contacts 128 located on flexible circuit carrier 104, which in turn make electrical contact with the corresponding contacts 108 located on printed circuit board 108.

Preferably, clip 102 can be integrally formed from stainless steel, beryllium copper, or any other metal or metal alloy which can provide for high enough yield strength to ensure that the clip 102 can be assembled and disassembled numerous times with a reliable connection occurring every time. In the preferred embodiment, the clip 102 was integrally formed from stainless steel.

Figure 3:
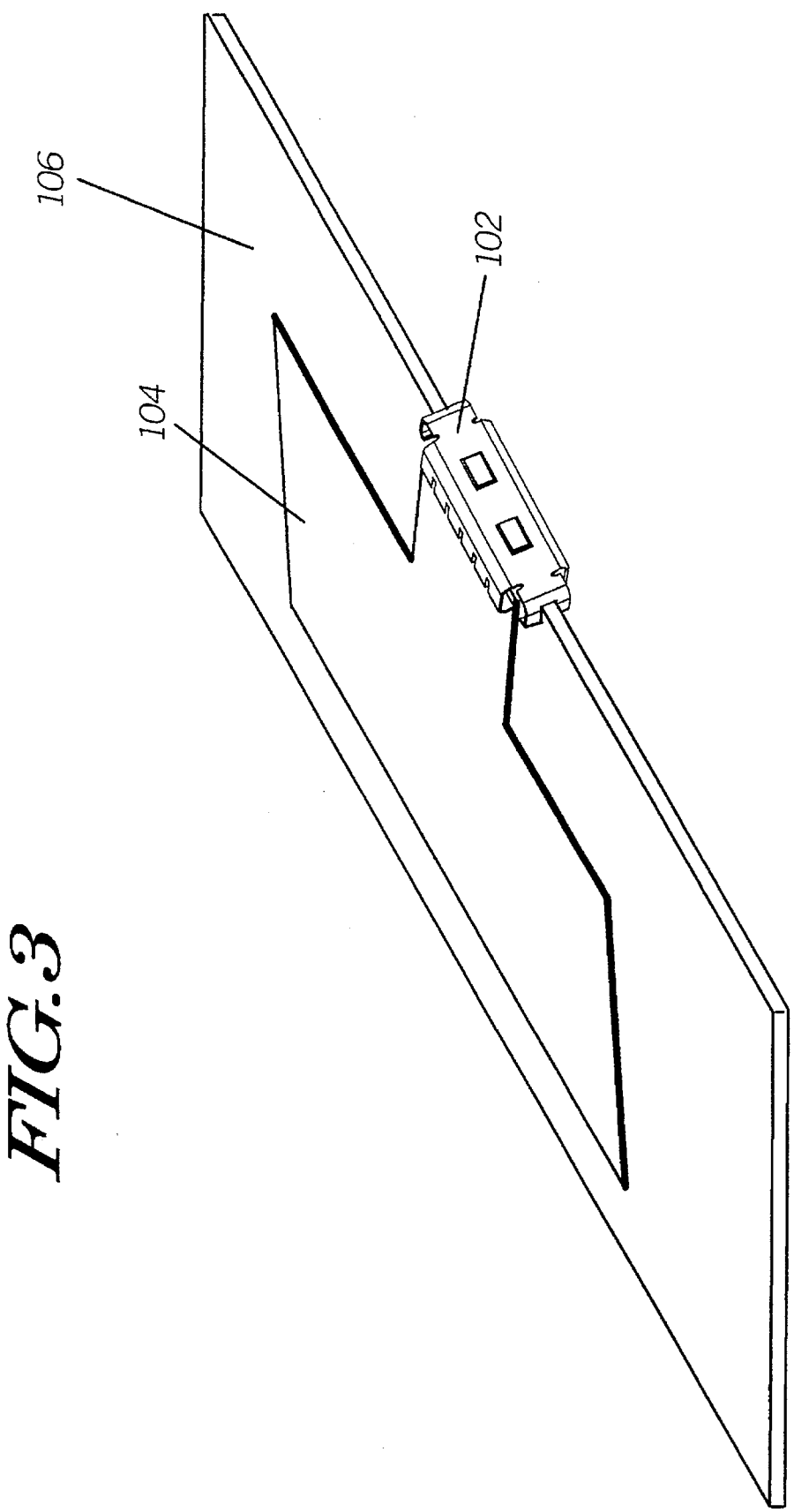
FIG. 3 shows the assembly of FIG. 1 interconnected together.

In FIG. 3, a fully connected retention clip 102 is shown. Retention clip 102 provides for a good electrical interconnect to occur between the interconnection pads 108 and the corresponding pads 128 located on flexible circuit carrier 104. In the preferred embodiment, each of the spring fingers 124 has a width which can cause pressure to be exerted on two adjacent interconnection pads 108 and corresponding pads 128 on the flexible circuit 104. The spring fingers 124 help ensure that each the matching PCB pads 108 and flex circuit pads 128 once aligned with each other, are provided enough force against each other, such that a low resistance connection is made at each set of matching pads. The gap between the bumped end sections 126 of the top row fingers and bottom row fingers 124 is such that a pressure fit is caused to develop when the retention clip is pressed into retention features 114 on printed circuit board 106.

In order to further clarify the present invention, the assembly and disassembly processes will now be described. In order to interconnect the printed circuit board 106 to flexible circuit carrier 104, flexible circuit carrier 104 is pressed into the edge of the printed circuit board 106 using locating features 110 found on the printed circuit board 106. The flexible circuit 104 is pressed against the printed circuit board 106 until it hits against stop edges 128 located on the edge surface of the printed circuit board 106 and shown in FIG. 1. The stop edges 128 and locating features 110 guarantee that the interconnection pads 108 located on printed circuit board 106, and pads 128 located on flexible circuit carrier 104, are aligned with each other, and ready to be compressed against each other. The next step requires that retention clip 102 be located to the lead-in ramps 132 located on the lead-in edges of retention features 114. Finally, the retention clip 102 is pressed onto the printed circuit board 106 until the retention clip retainers 122 engage on the sides with the retention features 114 located on the printed circuit board 106. The pressing of the retention clip 102 onto printed circuit board 106 causes the end-sections 120 to deflect inward, allowing for a pressure fit between the cantilevered end-sections 120 and retention features 114. Once clip 102 is inserted on to PCB 106, the plurality of spring fingers 124 become mechanically biased and put downward pressure (squeeze) the flex circuit contacts 128 against the printed circuit board contacts 108.

To disassemble an interconnected assembly, the two side locks 120 on the clip 102 are pressed inward by pressing in on each of the end-sections 120. This causes the retention features 114 to disengages from the clip's PCB side locks 122. The clip 102 can then be pulled off the assembly. Finally, the flexible circuit carrier 104 can be removed from the printed circuit board 106.

In summary, the present invention helps to reduce the cost of interconnecting a printed circuit board 106 to a flexible circuit carrier 104. The interconnection scheme presented by the present invention also provides the ability to easily assemble and disassemble the connection numerous times, while still maintaining both mechanical and electrical integrity. By incorporating the necessary detail and features on to the flexible circuit carrier 104 and printed circuit board 106, and only incurring the cost of an inexpensive clip 102, the cost for interconnecting each line is substantially reduced.

What is claimed is:

1. An interconnection clip for interconnecting a flexible circuit carrier to a printed circuit board, comprising:

a main section having top and bottom and first and second side margins;

first and second rows of spring finger contacts, the first row of spring finger contacts extending from the top margin and the second row of spring finger contacts extending from bottom margin of the main section;

first and second cantilevered end sections, the first cantilevered end section extending from the first side margin and the second cantilevered end section extending from the second side margin of the main section; and at least one alignment aperture located on the main section for permitting alignment of the clip to the printed circuit board.

2. An interconnection clip as defined in claim 1, wherein the first and second rows of spring finger contacts are curved towards each other.

3. An interconnection clip as defined in claim 2, further comprising:

an aperture on each of the first and second cantilevered end sections.

4. An interconnection clip as defined in claim 3, wherein the each of the spring fingers on the first and second rows have bumped end members.

5. An interconnection clip as defined in claim 4, wherein each of the first and second cantilevered end sections have curved end portions.

6. An interconnection clip as defined in claim 1, wherein the clip is formed from stainless steel.

7. An interconnection clip as defined in claim 1, wherein the clip is formed from beryllium copper.

8. An interconnection assembly for interconnecting a flexible circuit carrier to a printed circuit board using a retention clip, comprising:

the printed circuit board including:
first and second major surfaces and an edge surface; and
a plurality of interconnection pads located on at least one major surface;

the flexible circuit carrier including:
first and second major surfaces; and
a plurality of pads located on at least one major surface; and the retention clip including:
a main section having top and bottom and first and second side margins; and
first and second rows of spring finger contacts, the first row of spring finger contacts extending from the top margin and the second row of spring finger contacts extending from the bottom margin of the main section at least one alignment aperture located on the main section permitting alignment of the printed circuit board and the flexible circuit carrier, such that the plurality of pads on the flexible circuit carrier are electrically coupled one each to the plurality of interconnection pads located on the printed circuit board by the first and second rows of spring finger contacts which mechanically bias the plurality of pads on the flexible circuit board against the plurality of interconnection pads located on the printed circuit board during interconnection via the retention clip.

9. An interconnection assembly as defined in claim 8, further comprising:

at the printed circuit board:
 a locating feature and first and second retention features located on the edge surface; and at the flexible circuit carrier:
 at least one alignment aperture through said first and second major surfaces, such that the alignment apertures on the flexible circuit carrier and the main section of the retention clip are received by the printed circuit board locating feature in order to align the flexible circuit to the printed circuit such that the plurality of pads on the flexible circuit carrier and the plurality of interconnection pads on the printed circuit board are in substantial registration with each other.

10. An interconnection assembly as defined in claim 9, wherein the flexible circuit carrier is folded about the edge surface of the printed circuit board.

11. An interconnection assembly as defined in claim 9, wherein the retention clip further comprises:
 first and second cantilevered end sections, the first cantilevered end section extending from the first side margin and the second cantilevered end section extending from the second side margin of the main section.

12. An interconnection assembly as defined in claim 11, wherein the first and second cantilevered end sections each include an aperture; and
 wherein the printed circuit board includes first and second retention features permitting the apertures on the first and second cantilevered end sections to latch onto the first and second retention features during interconnection.

13. An interconnection assembly for interconnecting a flexible circuit carrier to a printed circuit board using a retention clip, comprising:

the printed circuit board including:
 first and second major surfaces and an edge surface;
 a plurality of interconnection pads located on the first major surface; and
 an alignment protrusion located on the edge surface; and the flexible circuit carrier including:
 first and second major surfaces;
 an alignment aperture located through said first and second major surfaces; and
 a plurality of pads located on the second major surface; and the retention clip including:
 a main section having top and bottom and first and second side margins;
 an alignment aperture through said main section; and
 first and second rows of spring finger contacts, the first row of spring finger contacts extending from the top margin and the second row of spring finger contacts extending from bottom margin of the main section, such that the alignment aperture on the flexible circuit is received by the alignment protrusion located on the printed circuit board, the flexible circuit is folded about the edge surface of the printed circuit board and the plurality of pads on the flexible circuit carrier are electrically coupled one each to the plurality of interconnection pads located on the printed circuit board by the first and second rows of spring finger contacts when said alignment aperture located on the retention clip is received by the alignment protrusion located on the printed circuit board.

14. An interconnection assembly as defined in claim 13, wherein the printed circuit board further includes a retention feature located at the edge surface and the retention clip includes a retention aperture which is received by the retention feature for mechanically securing the retention clip to the printed circuit board.

15. An interconnection assembly as defined in claim 13, wherein the locking aperture of the retention clip is located on a cantilevered end member which extends from the main section of the retention clip.

* * * * *